(12) United States Patent
Splett et al.

(10) Patent No.: US 6,888,485 B2
(45) Date of Patent: May 3, 2005

(54) DIGITAL-ANALOG CONVERTER

(75) Inventors: Armin Splett, Ulm (DE); Gunter Wolff, Ulm (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/312,761

(22) PCT Filed: Jun. 13, 2001

(86) PCT No.: PCT/DE01/02211

§ 371 (c)(1),
(2), (4) Date: Mar. 25, 2003

(87) PCT Pub. No.: WO02/01724

PCT Pub. Date: Jan. 3, 2002

(65) Prior Publication Data

US 2003/0181172 A1 Sep. 25, 2003

(51) Int. Cl.[7] .................................. H03M 1/66
(52) U.S. Cl. .................. 341/144; 341/341; 341/127
(58) Field of Search ............................. 341/118, 127, 341/136, 144, 145, 152

(56) References Cited

U.S. PATENT DOCUMENTS

| 4,663,610 A | * | 5/1987 | Metz et al. ............. 341/133 |
| 5,231,395 A | * | 7/1993 | Irwin et al. .................. 341/143 |
| 5,321,401 A | * | 6/1994 | White ......................... 341/147 |
| 5,544,081 A | | 8/1996 | Yukawa |
| 5,625,360 A | | 4/1997 | Garrity et al. |
| 6,433,720 B1 | * | 8/2002 | Libove et al. .............. 341/144 |
| 6,486,814 B2 | * | 11/2002 | Koyanagi .................. 341/144 |
| 6,628,220 B2 | * | 9/2003 | Cosand ....................... 341/144 |
| 6,664,906 B2 | * | 12/2003 | Volk .......................... 341/118 |

FOREIGN PATENT DOCUMENTS

| DE | 3637650 | 5/1987 |
| EP | 0577887 A | 1/1994 |
| WO | WO95/01006 A | 1/1995 |

* cited by examiner

Primary Examiner—Michael Tokar
Assistant Examiner—Linh V Nguyen
(74) Attorney, Agent, or Firm—Staas & Halsey LLP

(57) ABSTRACT

A digital-analog converter for mobile radiotelephone base stations includes a D flip-flop and a modulator. The D flip-flop is clocked by a clock signal and a digital input signal is fed to an input of the D flip-flop to produce an output signal. The modulator multiplies the output signal produced from the D flip-flop with the clock signal and outputs an analog output signal indicative thereof.

15 Claims, 2 Drawing Sheets

DIGITAL-ANALOG CONVERTER

CROSS REFERENCE TO RELATED APPLICATIONS

This application is based on and hereby claims priority to PCT Application No. PCT/DE01/02211 filed on 13 Jun. 2001 and German Application No. 100 31 538.0 filed 28 Jun. 2000, the contents of which are hereby incorporated by reference.

BACKGROUND OF THE INVENTION

Digital-analog converters of this type are used in particular in mobile radiotelephone base stations in order to convert digital data having a high bit rate into high-frequency transmission signals. In this situation, the high-frequency transmission signals are to be generated with a high level of spectral purity, in other words they should exhibit as few unwanted spurious frequencies as possible. Moreover, this should be achieved cost-effectively with the smallest possible demand on technical resources. In the typical case, the high-frequency transmission signals should have one or more modulated frequency carriers and be capable of covering a large bandwidth.

To date, architectures have been employed for this purpose which use known digital-analog converters to generate high-bandwidth analog signals in a frequency range which is too low for transmission. Subsequently, the analog signals are then converted by one or two frequency converter stages, for example mixer stages, into the high-frequency transmission signals in order to be sent by radio from the mobile radiotelephone base station.

The mixer stages, however, require a high level of resources in terms of circuitry, in particular a high demand for electronic components. In general, the mixer stages cannot be implemented as integrated circuits since filters having a high quality level must be used and, as is known, these require a large number of passive components such as capacitors and resistors. Passive components cannot however be conveniently implemented in integrated circuits, particularly when precise and in part high capacitance and/or inductance values are required for high-quality filters. Furthermore, all intermediate frequencies must be screened off separately. In order to provide a cost-effective and thus economical solution, a digital-analog converter would therefore be required which comprises a small number of electronic components, passive components in particular, and is preferably suitable for implementation as an integrated circuit.

SUMMARY OF THE INVENTION

Various aspects and advantages of the invention will be set forth in part in the description that follows and, in part, will be obvious from the description, or may be learned by practice of the invention.

One possible object of the invention is therefore to create a digital-analog converter which has a simple structure, in particular avoids high-quality filters, and can therefore preferably be implemented as an integrated circuit. Furthermore, the digital-analog converter should generate an analog output signal which can be used as a high-frequency transmission signal.

The digital-analog converter includes two basic structures, namely a D flip-flop and a modulator which is connected downstream of the D flip-flop. The D flip-flop is clocked by a clock signal and a digital input signal is fed to the input of the D flip-flop, which digital input signal is to be converted into an analog output signal. One possible of the purpose of the device is to generate an analog output signal in a frequency range which is suitable for transmission. The analog output signal must therefore lie in the frequency range for high-frequency transmission signals. To this end, the output signal from the D flip-flop is multiplied with the clock signal by the modulator. In the modulator, the clock signal is distorted in such a way that the zero transitions of the clock signal are extended in time. Accordingly, jitter contained in the output signal from the D flip-flop is effectively suppressed in the modulator during the zero transitions of the distorted dock signal.

The spectral purity of the analog output signal from the modulator is essentially determined by the spectral purity of the clock signal. In this situation, no clock signals having different phases for the D flip-flop and the modulator are required as in the case of previous approaches to a solution on the basis of the related art. For this reason, a 90 degree phase shifter is also dispensed with. In addition, the frequency is lower than in the case of known digital-analog converters whose output signals lie directly in the high-frequency range. This results from the fact that the modulator additionally converts the frequency of the output signal from the D flip-flop in such a way that all the harmonics are superimposed constructively and no unnecessary quantization noise is added.

By preference, the clock signal is a sinusoidal signal of high spectral purity. As a result of this, an analog output signal is generated at the modulator with a particularly high level of spectral purity, in other words essentially having no unwanted spurious frequencies.

The following values have proved to be particularly advantageous for the frequency of the digital input signal and the frequency of the clock signal: The digital input signal should occupy a frequency range at one quarter of the clock frequency. In the analog output spectrum, on the other hand, the frequency range proves to be particularly favorable at five quarters of the clock frequency.

It generally proves to be favorable if the frequency range of the digital input signal lies at one quarter of the clock frequency and the analog output signal lies at $(2n+1)$ quarters of the clock frequency. In this situation, it is particularly favorable if the condition $n=4k+1$ or $n=4k+2$ where $k=0, 1, 2, \ldots$ is satisfied.

By preference, $n=2$ is chosen since in this instance the advantageous relationship mentioned previously results, namely that the frequency of the digital input signal lies at one quarter of the clock frequency and the analog output signal lies at five quarters of the clock frequency.

An embodiment of the D flip-flop and of the modulator employing bipolar technology is, by preference, suitable for the extremely high frequency which normally has to be produced for the analog output signal and also for the high frequency of the digital input signal. An embodiment employing a fast MOS technology is also conceivable. As is known, both aforementioned technologies are particularly suited for integration of the circuit employing silicon technology or also GaAs technology.

The digital-analog converter can be operated in a particularly advantageous manner if the digital input signal is noise-shaped, whereby the quantization noise of the digital signal is shifted into frequency ranges which contain no signal constituents. This can be realized for example by a sigma-delta modulator which is connected upstream.

The digital-analog converter is similarly advantageously suited for a multi-stage construction; to this end, simply a plurality of digital-analog converters is connected a parallel configuration whereby different digital input signals are fed to the inputs of the D flip-flops in each case and the corresponding analog output signals are simply added at the outputs of the modulators. This embodiment can additionally be advantageously implemented as an integrated circuit.

BRIEF DESCRIPTION OF THE DRAWINGS

These and/or other aspects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Hereinafter, aspects of the present invention will be described in detail with reference to the attached drawings. The present invention may, however, be embodied in many different forms and should not be construed as being limited to the aspects set forth herein; rather, these aspects are provided so that the present disclosure will be thorough and complete, and will fully convey the concept of the invention to those skilled in the art.

Figure 1:
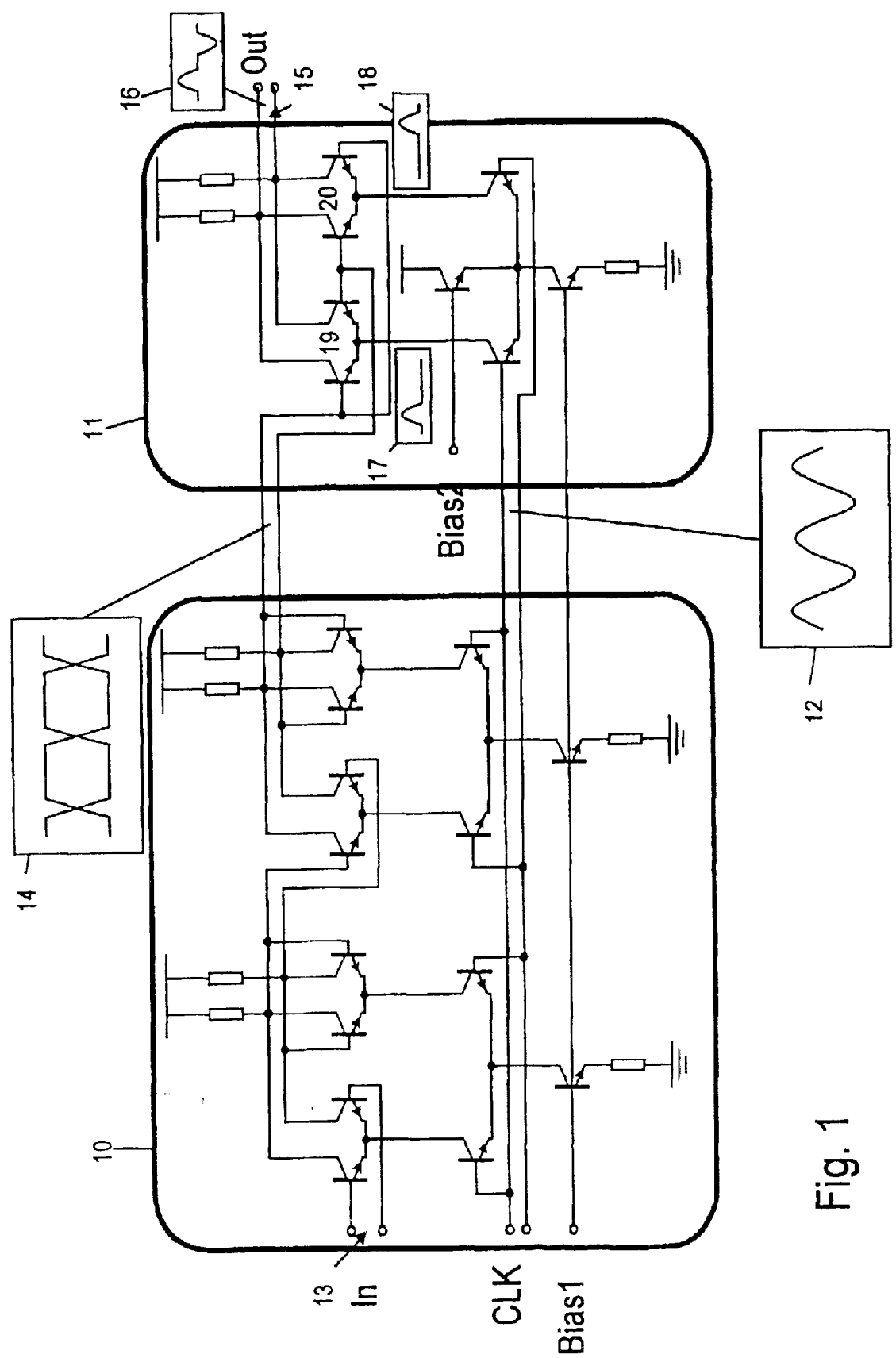
FIG. 1 shows an embodiment according to one aspect of the invention of the digital-analog converter employing bipolar technology.

Reference character 10 in FIG. 1 denotes a D flip-flop in bipolar technology, having in each case a differential input "In" for a digital input signal 13 which is to be converted into an analog output signal lying in a frequency range which is particularly suited for transmission of the output signal by way of a mobile radio channel. In addition, the power consumption of the D flip-flop 10 is set by way of an input denoted by "Bias1".

Finally, the D flip-flop 10 has a further differential input "CLK" for a clock signal 12. The clock signal 12 corresponds—as illustrated in FIG. 1—to a sinusoidal signal of high spectral purity with a frequency of four fifths of a default frequency, at which the frequency $f_{Out}$ of the analog output signal to be generated lies. The greater the stability of frequency of the clock signal 12, in other words the less phase noise it exhibits, the higher is also the level of purity of the frequency spectrum of the analog output signal to be generated. In the ideal situation, the clock signal is a sinusoidal signal of high spectral purity, in other words it is essentially free from unwanted spurious frequencies.

A modulator 11 which is similarly implemented in bipolar technology is connected downstream of the D flip-flop 10. Like the D flip-flop 10, it is possible to set the power consumption of the modulator 11 by way of the input denoted by "Bias1". Moreover, the setting of the threshold value for the pulse distortion is effected by way of an input denoted by "Bias2". In principle, the modulator 11 corresponds to a multiplier circuit which multiples the output signal 14 from the D flip-flop 10, whose idealized eye pattern is represented schematically, with the clock signal 12. However, before the two signals are multiplied the clock signal 12 is distorted in such a way in the modulator 11 that the zero transitions of the clock signal, or more precisely the zero transitions of the sinusoidal clock signal, are extended in time, as is shown schematically using the two small signal waveform diagrams 17 and 18. As a result of this distortion of the clock signal, any jitter which may be contained in the output signal 14 from the D flip-flop 10 is essentially suppressed in an effective manner.

After the clock signal 12 has been distorted in the modulator 11, the multiplication with the output signal 14 from the D flip-flop 10 is performed by two differential changeover stages 19 and 20 connected in parallel. At the collectors of the transistors of the two differential changeover stages 19 and 20 an analog digital signal 16 is present—as illustrated schematically—at an output 15 of the modulator 11. In this situation, the analog output signal 16 lies in a frequency range which corresponds to the transmission frequency range, in other words the frequency range for the transmission of radio signals in a mobile radiotelephone base station. A further conversion of the analog output signal to another frequency range is therefore no longer required. Corresponding mixer stages can be dispensed with.

The highly symmetrical structure both of the D flip-flop 10 and also of the modulator 11 can be recognized from FIG. 1, as a result of which undesired phase displacements of the signals to be processed scarcely occur. Particularly in the case of implementation as an integrated circuit, a high level of symmetry for the D flip-flop 10 and the modulator 11 can be achieved since as is known the properties of transistors can be set very precisely in relation to one another in an integrated situation.

Figure 2:
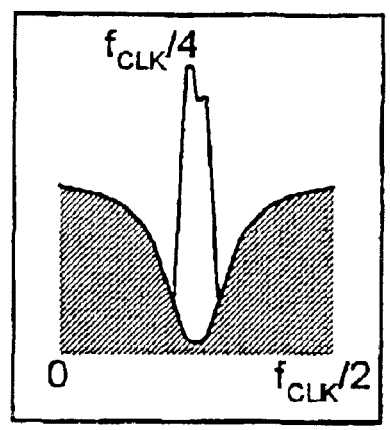
FIG. 2 shows the characteristic part of the frequency spectrum at the output of the D flip-flop used in the digital-analog converter illustrated in FIG. 1.

FIG. 2 shows the characteristic part of the frequency spectrum for the D flip-flop 10. The digital input signal 13 of the D flip-flop, which is surrounded by shaped quantization noise (shown hatched), lies at one quarter of the clock frequency in the frequency spectrum. The output signal 14 from the D flip-flop 10 is converted by the modulator 11 into different frequency ranges at (2n+1) quarters of the clock frequency.

Figure 3:
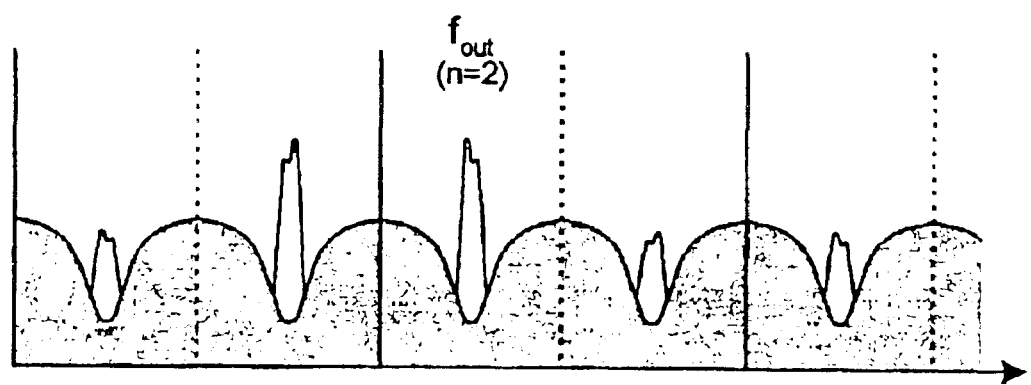
FIG. 3 shows the basic frequency spectrum of the analog output signal from the digital-analog converter illustrated in FIG. 1.

The basic frequency spectrum of the output signal at the output 15 of the modulator 11 is illustrated in FIG. 3. Depending on the shape of the individual pulses 17, 18 in the modulator, the analog output signal appears with differing strengths in the individual frequency ranges which lie at (2n+1) quarters of the clock frequency. Between the individual peaks in the frequency ranges where the analog output signal is present there are areas which contain no signal. These areas contain the shaped quantization noise which is shown hatched. This can be removed along with the undesirable signal bands by appropriate filtering, for example in a narrow-band transmitter stage.

It has proved to be particularly advantageous when the frequency of the digital input signal lies at one quarter of the clock frequency and the analog output signal occupies the frequency band at five quarters of the clock frequency.

It generally holds true that frequency values at one quarter of the clock frequency are favorable for the digital input signal and that output signals thus result at (2n+1) quarters of the clock frequency (advantageous where n=4k+1 or n=4k+2).

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A digital-analog converter for mobile radiotelephone base stations, comprising:
   a D flip-flop clocked by a clock signal, wherein a digital input signal is fed to an input of the D flip-flop to produce an output signal; and
   a modulator to distort the clock signal and produce a distorted clock signal having passages through zero that are delayed, the modulator multiplying the output signal from the D flip-flop with the distorted clock signal and outputting an analog output signal indicative thereof.

2. The digital-analog converter according to claim 1, wherein the analog output signal is free of spurious frequencies.

3. The digital-analog converter according to claim 2, wherein the frequency of the digital input signal is one quarter of the clock frequency and the frequency of the analog output signal is (2n+1) quarters of the frequency of the clock signal, where n=4k+1 or n=4k+2 and k is a predetermined integer.

4. The digital-analog converter according to claim 3, wherein the frequency of the analog output signal is n (frequency of clock signal), where n=4k+1 or n=4k+2, and where k is a predetermined integer.

5. The digital-analog converter according to claim 4, wherein the D flip-flop and the modulator are implemented in bipolar technology.

6. The digital-analog converter according to claim 5, wherein a quantization noise of the input signal is spectrally shaped by a sigma-delta modulator.

7. The digital-analog converter according to claim 6, further comprising:
   digital-analog converters; and
   D flip-flops, wherein the digital-analog converters are connected in parallel feeding different digital input signals to inputs of the D flip-flops to produce corresponding analog output signals, where the analog output signals are added at the outputs of the modulators.

8. The digital-analog converter according to claim 1, wherein the frequency of the digital input signal is one quarter of the clock frequency and the frequency of the analog output signal is (2n+1) quarters of the frequency of the clock signal, where n=4k+1 or n=4k+2 and k is a predetermined integer.

9. The digital-analog converter according to claim 1, wherein the frequency of the analog output signal is n (frequency of clock signal), where n=4k+1 or n=4k+2, and where k is a predetermined integer.

10. The digital-analog converter according to claim 1, wherein the D flip-flop and the modulator are implemented in bipolar technology.

11. The digital-analog converter according to claim 1, wherein a quantization noise of the input signal is spectrally shaped by a sigma-delta modulator.

12. The digital-analog converter according to claim 1, further comprising:
    digital-analog converters; and
    D flip-flops, wherein the digital-analog converters are connected in parallel feeding different digital input signals to inputs of the D flip-flops to produce corresponding analog output signals, where the analog output signals are added at the outputs of the modulators.

13. The digital-analog converter according to claim 2, wherein the distorted clock signal generates the analog output signal which is free of spurious frequencies.

14. The digital-analog converter according to claim 1, wherein the D flip-flop and the modulator are implemented in MOS technology.

15. The digital-analog converter according to claim 1, wherein the D flip-flop and the modulator are implemented in GaAs technology.

* * * * *